(12) United States Patent
Gattiker

(10) Patent No.: US 7,991,574 B2
(45) Date of Patent: Aug. 2, 2011

(54) TECHNIQUES FOR FILTERING SYSTEMATIC DIFFERENCES FROM WAFER EVALUATION PARAMETERS

(75) Inventor: Anne Elizabeth Gattiker, Austin, TX (US)

(73) Assignee: International Business Machines Corporation, Armonk, NY (US)

( * ) Notice: Subject to any disclaimer, the term of this patent is extended or adjusted under 35 U.S.C. 154(b) by 727 days.

(21) Appl. No.: 12/021,670

(22) Filed: Jan. 29, 2008

(65) Prior Publication Data

US 2009/0192765 A1 Jul. 30, 2009

(51) Int. Cl.
*G01R 31/00* (2006.01)
(52) U.S. Cl. .................... 702/118; 702/81; 324/512
(58) Field of Classification Search ............... 702/81–84, 702/117, 118; 324/500, 512; 356/630, 237.4, 356/237.5; 382/149, 145
See application file for complete search history.

(56) References Cited

U.S. PATENT DOCUMENTS

| | | | | |
|---|---|---|---|---|
| 5,381,103 | A | * | 1/1995 | Edmond et al. ............... 324/753 |
| 6,057,924 | A | * | 5/2000 | Ross et al. .................... 356/632 |
| 2008/0244348 | A1 | * | 10/2008 | Kadosh et al. ................ 714/742 |

OTHER PUBLICATIONS

Gattiker, et al., "Data Analysis Techniques for CMOS Technology Characterization and Product Impact Assessment", International Test Conference 2006, Lecture 3.3, pp. 1-10, IEEE Press.

Wong, et al., "Linewidth Variation Characterization by Spatial Decomposition", JMMM, Jul. 2002, vol. 1, No. 2, Society of Photo-Optical Instrumentation Engineers.

Cain, et al., "Electrical Linewidth Metrology for Systematic CD Variation Characterization and Causal Analysis", Proceedings of SPIE 2003, pp. 350-361, vol. 5308.

Cain, et al., "Optimum Sampling for Characterization of Systematic Variation in Photolithography", Proceedings of SPIE 2002, vol. 4689, SPIE , pp. 430-442.

Bhushan, et al., "Ring Oscillators for Process Tuning and Variability Control", IEEE Transactions in Semiconductor Manufacturing, Feb. 2006, pp. 10-18, vol. 19, No. 1, IEEE Press.

* cited by examiner

*Primary Examiner* — Manuel L Barbee
(74) *Attorney, Agent, or Firm* — Mitch Harris, Atty at Law, LLC; Andrew M. Harris; Libby Z. Toub

(57) ABSTRACT

A method, system and computer program product for filtering systematic differences from wafer evaluation parameters provides an efficient visual display and numerical map technique for observing wafer-level process variation. Measurement data is gathered from electronic circuits at multiple positions within multiple regions on one or more wafers and parameters are computed from the measurement data, which may be the measurement data values themselves. The set of parameters is filtered for expected systematic variation by computing a set of normalization values from the set of parameters and normalizing the data according to the normalization values. The normalized parameter set is then either presented in a visual display, e.g., by color mapping, or arranged in a numerical map of parameter value by location.

14 Claims, 6 Drawing Sheets

TECHNIQUES FOR FILTERING SYSTEMATIC DIFFERENCES FROM WAFER EVALUATION PARAMETERS

BACKGROUND OF THE INVENTION

1. Field of the Invention

The present invention is related to wafer characterization methods and measurements, and more particularly to a method, system and computer program product for isolating circuit or block level systematic differences from wafer measurement data and/or evaluation parameters computed therefrom.

2. Description of Related Art

Study of wafer-level measurement data variation, and/or evaluation parameters computed from measurement data, provides insight into several process mechanisms that cause significant differences in operation of circuits fabricated on a wafer. In particular systematic variations in etching and anneal processes across the wafer are typically independent of the systematic variations due to imaging processes, which cause variation on a particular basis. Characteristics of the wafer itself also may cause variation across the wafer. It is desirable to visualize and also to numerically characterize the wafer-level variation, so that processes and materials that cause such variation can be more uniformly controlled. Further, it is useful in debug of the design of circuits to eliminate such wafer-level variation as a source of a functionality or performance problem, for example when differences in performance are noted between multiple cores on a die. Once process variation is eliminated as a potential cause, then the design can be evaluated as to the underlying cause.

Within a given die, measurement data may be available from differing circuits that have differing features, e.g., circuits designed to measure different circuit parameters and/or functional circuits having different characteristics, but nonetheless exhibit variation due to the systematic wafer-level variation. Even if different circuits within a die are provided for measuring the same circuit parameter per-die and per-reticle systematic variations will typically be present. For the above reasons, a total collection of measurement data in general, and a visual display of the measurement data values or parameters computed from the measurement data values more specifically, typically yields a poor result in that all of the variation other than the wafer level variation contributes to visual and numerical "noise" that masks the wafer-level variation in other variation.

Therefore, existing techniques for visualizing and numerically mapping wafer-level variation typically either provide a display or map of one value per reticle, which may be aggregated and normalized, or may represent an individual circuit. Other visual displays and numerical maps present only the variation level per-reticle. Other systems that attempt to remove reticle level variation from wafer-level variation require generation of complex models that introduce error and are computationally and storage-allocation intensive.

Therefore, it would be desirable to provide an efficient method, system and computer program product for providing a display and/or numerical map of wafer-level variation that has been filtered to remove reticle/die level systematic variation and/or circuit level systematic differences and variation.

BRIEF SUMMARY OF THE INVENTION

The above objectives of providing an efficient wafer-level variation display or map that is filtered for reticle/die-level systematic variation and circuit level differences, is accomplished in a computer performed method and workstation computer, which may be a computer-controlled test system. The method is a method of operation of the computer system, which may be at least partially embodied in a computer program product including program instructions stored in computer-readable storage media for execution in a workstation computer system.

The computer system and method receive measurement data indicative of process variation on a wafer. The measurement data may be the frequency of operation of multiple ring oscillators per die, which may be of differing design and tailored for measuring particular differing processor or circuit parameters. The measurement data may also include different types of measurement data gathered from functional or characterization circuitry on the wafer, e.g., ring oscillator frequencies, leakage currents and other performance measurements that can be carried out at discrete positions along the dies and therefore along the wafer and may include data from circuits integrated on the kerf. The measurement data may also be operating parameters indicative of pass/fail operating conditions of functional circuitry, such as maximum operating frequency, minimum operating power supply voltage, power supply current limit level, access time of a memory, and the like. The operating parameters may also be differences between operating parameters for different portions of the circuit under test, for example the difference in clock frequency applied to different portions of a circuit, differences in power supply provided to different portions of the circuit, and so forth. The data is collected from multiple positions within multiple regions of the wafer.

A parameter for visualization and/or numerically mapping across the wafer is generated as a function of the measurement data, and may be the measurement data itself. The parameter values are computed from the measurement data and then filtered to remove expected per-position differences by normalizing with set of nominal parameter values for each position. The set of nominal parameter values is computed from the set of parameter values, e.g., by taking an average across the parameter values corresponding to each position within the multiple regions. The parameter values are then adjusted according to the nominal parameter values and the resulting normalized parameters are then displayed in a wafer-level map, e.g., by associating colors with ranges of values, or expressed as a numerical map of the deviations.

Outlier data may be discarded when determining the nominal parameter values using a threshold or other criterion, and the outlier rejection may be applied iteratively by observing the resulting deviations. In one embodiment, the parameter values may be normalized by region by computing a fractional deviation for each region and position from the differences between the per-position parameter values and the average per-position parameter values. A matrix of normalization values having dimensions by region and position can then be used to normalize the set of parameter values across the wafer. In another embodiment, average deviations per-position are computed by averaging per-region deviations.

The foregoing and other objectives, features, and advantages of the invention will be apparent from the following, more particular, description of the preferred embodiment of the invention, as illustrated in the accompanying drawings.

BRIEF DESCRIPTION OF THE SEVERAL VIEWS OF THE DRAWING

The novel features believed characteristic of the invention are set forth in the appended claims. The invention itself, however, as well as a preferred mode of use, further objectives, and advantages thereof, will best be understood by reference to the following detailed description of the invention when read in conjunction with the accompanying Figures, wherein like reference numerals indicate like components, and:

DETAILED DESCRIPTION OF THE INVENTION

The present invention relates to a process characterization method and system that provide graphical display and/or numerical mapping of circuit measurements or parameters generated from circuit measurements across a wafer. To permit a higher resolution than is possible with display of data from individual disparate circuits and/or differing measurement value types, and to further enhance the visibility/resolution of the process variation display even when circuits are of the same type, the present invention uses a normalization procedure that permits mapping of measurement values from circuits having different design and/or differing measurement value types to a single parameter that is mapped across the wafer. Wafer-level process variation can then be viewed in the graphical display or numerical map by noting changes in the parameter. The graphical display may use color gradations, intensity (color or white/black brightness) levels and the like to show the value of the parameter across the wafer. The measurement data is data taken from measurements of electrical operating parameters of circuits integrated on the wafer that are indicative of performance of the electrical circuits. In general, the measurement data may include both operating and non-operating performance indicators such as circuit operating frequency or a non-operating leakage current. The measurement data may also be a failure point operating parameter value such as maximum reliable operating frequency or voltage, where the failure point operating parameter is set by an external device, but the value is determined by observing the performance of the electrical circuits.

Figure 1:
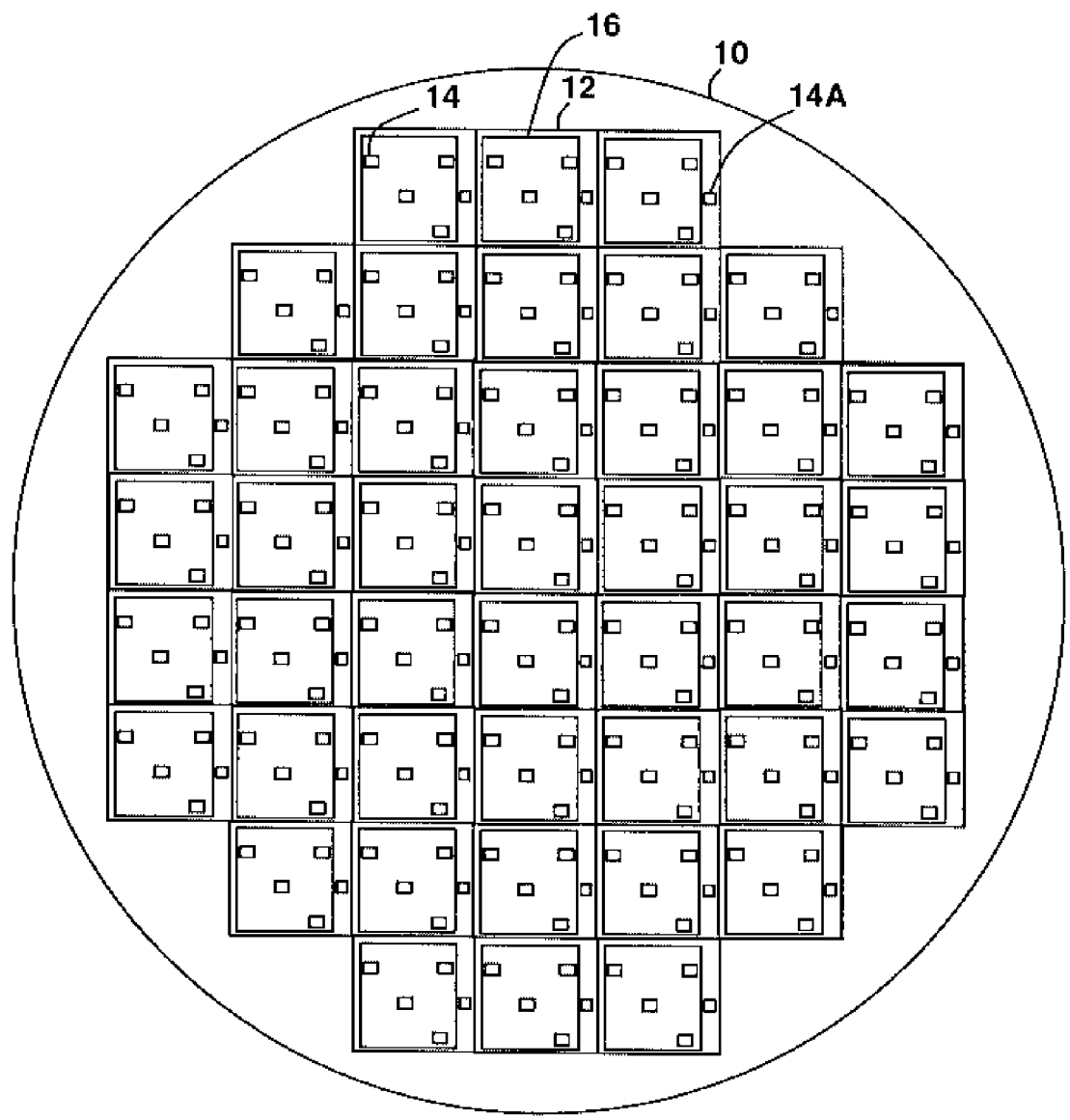
FIG. 1 is a pictorial view of a wafer including a set of functional and/or characterization circuits replicated on dies, that may be characterized using test methodologies and systems according to embodiments of the present invention.

Referring now to FIG. 1, a pictorial view of a wafer 10, divided into regions 12 is shown. In the depicted example, regions 12 correspond to reticles, which are the optical frames used in imaging of the wafer during fabrication. However, assignment of regions 12 to reticles is not a limitation of the present invention and the techniques of the present invention can be used on a per-die basis in a multi-die reticle, on a per-core basis in a multi-core die, or applied to any other wafer region for which repetitive systematic differences are present for circuit measurements across the wafer. In the depicted embodiment, circuits 14 that are used in the evaluation of wafer variation are located within the reticles (regions 12) and are integrated on one or more dies 16 within the reticles at predetermined positions within regions 12 and have expected identical circuit measurements for each of the positions within each region 12. However through a parameterization process described below, circuits 14 can also represent differing circuits for which data measurement is normalized, e.g., the measurement data for each circuit can be divided by an expected measurement value determined from simulations, thereby rendering an expected measurement value of unity for each of circuits 14, irrespective of the nominal measurement value or data type for each circuit 14. Additional circuits 14A may be located within the kerf area outside of dies 16 and may either be treated as identical to corresponding circuits 14 within region 12, or compensation may be made for expected variation due to their presence in the kerf. Further, multiple die types per reticle may be used, as the wafer-level analysis provided by the present invention can operate independently of die type, as circuits 14 on various dies will be normalized to remove their individual differences in expected measurement value.

Circuits 14,14A may include co-located pairs or larger groups of circuits and the parameters generated from measurement data may be mathematical functions of measurement data from the different circuits in the collocated groups within circuits 14,14A. For example, each of circuits 14,14A may include multiple ring oscillators having different circuit designs, and therefore differing operating frequencies, but the parameter to be mapped may be the difference or ratio between the frequencies, so that a single parameter is generated from multiple measurement data values. Conversely, the parameter to be mapped may be the measurement data itself, when all of the circuits are identical and/or have identical expected measurement values. By "expected" parameter or measurement values when used herein, the expected value is the value expected without process variation, so that deviation between the expected values and the actual values reveal the effects of process variation. (I.e., process variation, although "expected" as a result of fabrication of actual circuits, systematic or statistical changes due to process variation are not included in the expected values as used herein.)

The types of measurement data, the units of the measurement data and the circuits used to provide the measurement data may all differ within a single region 12, but repeat for each region. Measurements that may be used include, but are not limited to: test ring oscillator frequency, frequency of operation at failure, current consumed by a circuit during operation, leakage current and/or power supply voltage at failure. The present invention parameterizes the measurement data to remove expected circuit differences, and to remove differences in measurement data type as needed. The parameters may also provide quantities that have enhanced or a meaning different from the measurement data, e.g., the operating frequency of a ring oscillator having a PFET pass transistor inserted between each stage can be compared to the frequency of a co-located reference ring oscillator providing an indication of PFET threshold voltage. In a more general example, a parameter may be provided by the frequency difference or frequency ratio of two ring oscillators co-located on a die, e.g., two ring oscillators may be included within each of the individual circuits 14,14A depicted in the Figure and their frequency difference computed as the parameter. As another example, the parameter may be the maximum operating frequency or leakage current of individual dies 16 or individual circuits within regions 12. Also, a parameter may be formed from multiple measurements of the same individual circuit. For example a parameter could be the ratio of leakage current to maximum operating frequency for a core, the ratio of ring oscillator frequency for two different power supply voltages applied to the same circuit(s), and functions of any number of measurements performed on the same circuit under differing conditions and/or different measurement types. As mentioned above, the parameter may be the measurement data when the measurements are single values for each position, have the same data type and are expected to "track" the process variation in the same manner. The measurement data may also be parameterized in some embodiments by subtracting or taking a ratio to an expected value generated from simulations or large-scale measurement data studies.

Figure 2:
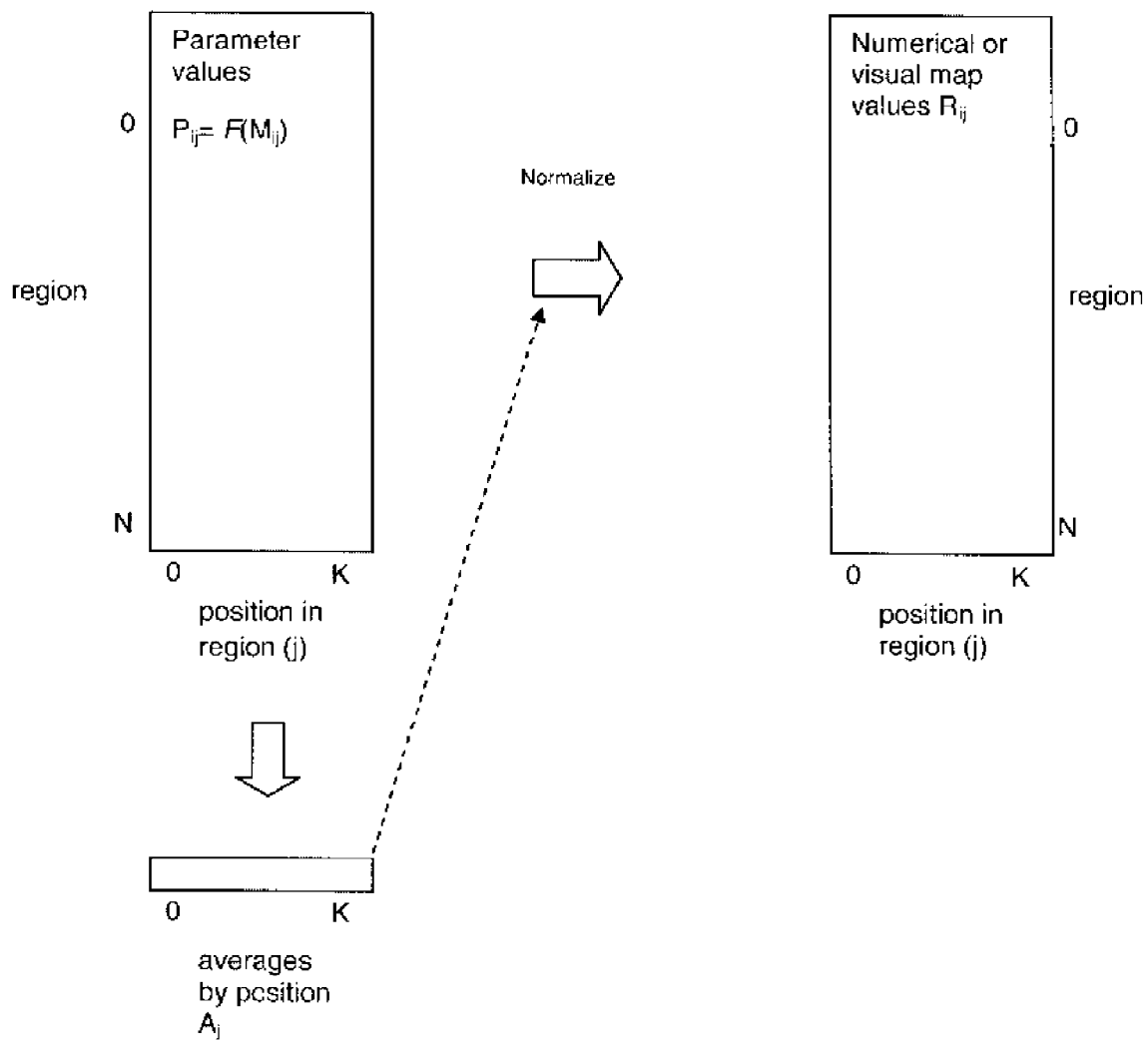
FIG. 2 is a block diagram depicting techniques of a method in accordance with an embodiment of the present invention.

With further reference to FIG. 2, a block diagram is shown illustrating a normalization method in accordance with an embodiment of the present invention. The parameter values as described above are arranged in a matrix for illustration as parameter values $P_{ij}$, where i is the index i:[0,N] of the region 12 containing the circuit(s) 14,14A that provided the measurement data $M_{ij}$ for the parameter F(M) and j:[0,K] is the index of the position of circuit 14,14A within region 12. In the wafer illustrated in FIG. 1, N=43 and K=4, as there are 44 regions 12 and 5 circuits (or circuit groups) 14,14A within each region 12. For each position index j, an average $A_j$ of the parameter values $P_{ij}$ in the corresponding column of the matrix is computed. The averages $A_j$ are then used to normalize the parameter values to generate the numerical/visual map values by subtracting the corresponding averages from each of the parameter values: $R_{ij}=P_{ij}-A_j$. The normalized values are then used to select the color/intensity of rectangles, circles, points or other graphical object on a graphical wafermap at the position corresponding to each normalized value.

Figure 3:
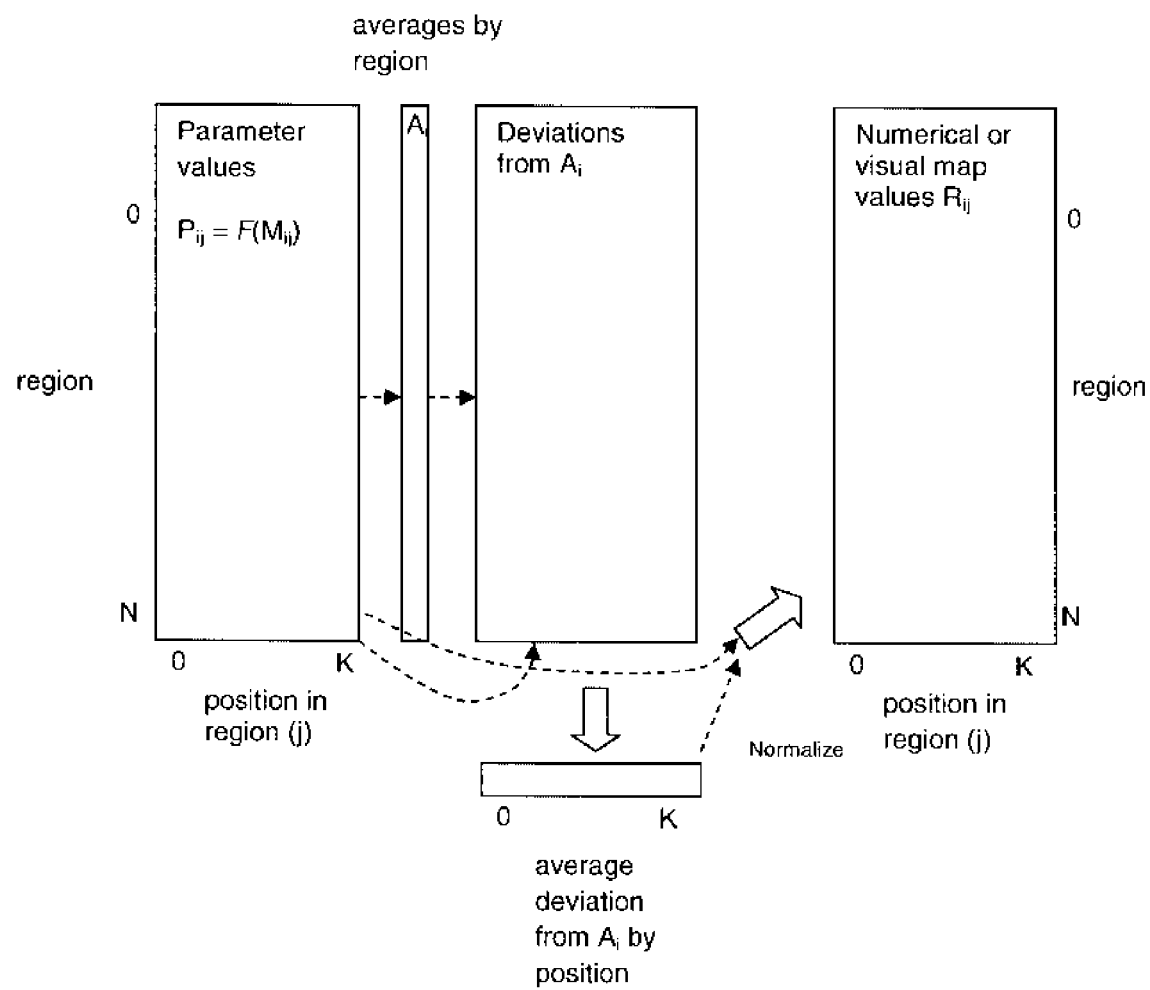
FIG. 3 is a block diagram depicting techniques of a method in accordance with another embodiment of the present invention.

Referring now to FIG. 3, a block diagram is shown illustrating a normalization method in accordance with another embodiment of the present invention. The technique and intent is similar to that described above with respect to FIG. 2, so only differences between them will be described below. Rather than subtracting position-based average values $A_j$ directly from parameter values $P_{ij}$ as in FIG. 1, in the technique illustrated in FIG. 3, region averages $A_i$ for each region i are computed first. Then the deviation of each parameter value is computed for each position and region. The average deviation (from the regional average) for each position is computed to obtain normalization values, which are then subtracted from the corresponding parameter values to yield the normalized parameter values used in the numerical map or to generate the visual display as described above. The technique of FIG. 3 is particularly advantageous when variation by regions 12 is significant, as the filtering in the technique illustrated in FIG. 3 will compensate for those variations before determining position averages.

Figure 4:
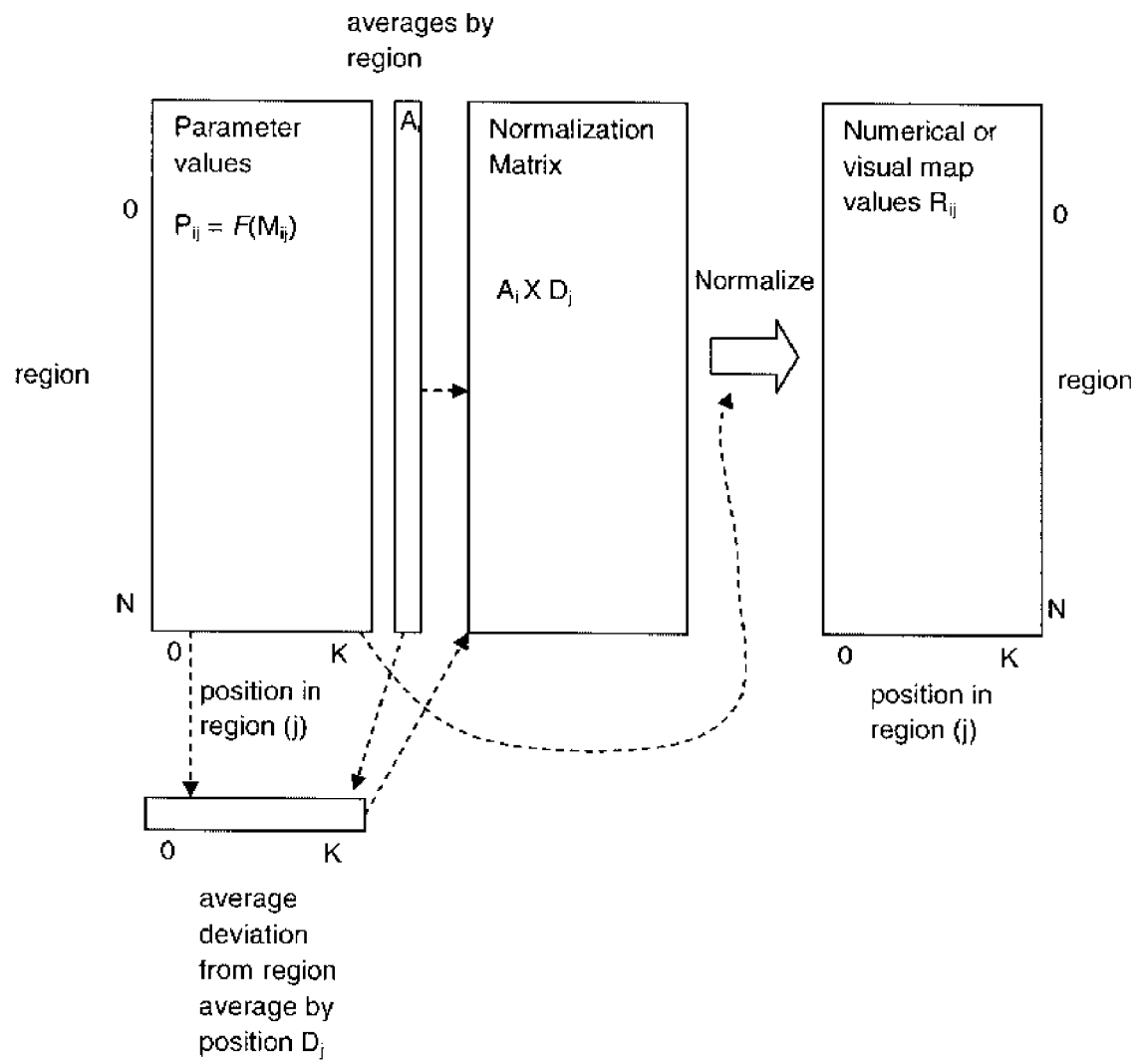
FIG. 4 is a block diagram depicting techniques of a method in accordance with yet another embodiment of the present invention.

Referring now to FIG. 4, a block diagram is shown illustrating a normalization method in accordance with another embodiment of the present invention. The technique and intent is similar to that described above with respect to FIG. 2 and FIG. 3, so only differences between them will be described below. In the technique illustrated in FIG. 4, region averages $A_i$ for each region i are computed as in FIG. 3. But, rather than normalizing using a per-position average of all of the deviations from their corresponding per-region average as in FIG. 3, the average deviation $D_j$ is computed for each position j using the region average $A_i$. The average deviation can be computed by subtracting the region average $A_i$ from parameter values $P_{ij}$ for each region i within each position j, dividing that result by region average $A_i$, and averaging the result of the subtraction and division for each region i. The region averages $A_i$ are then cross-multiplied by the set of average deviations by position $D_j$, to yield a normalization matrix $A_i \times D_j$, which is then subtracted from the parameter values $P_{ij}$ to yield the normalized parameter values used in the numerical map or to generate the visual display as described above. The technique of FIG. 4 is particularly advantageous when position-dependent variation is proportional or otherwise dependent on the parameter values, as the filtering in the technique illustrated in FIG. 4 will compensate for the parameter value dependent variations.

Figure 5:
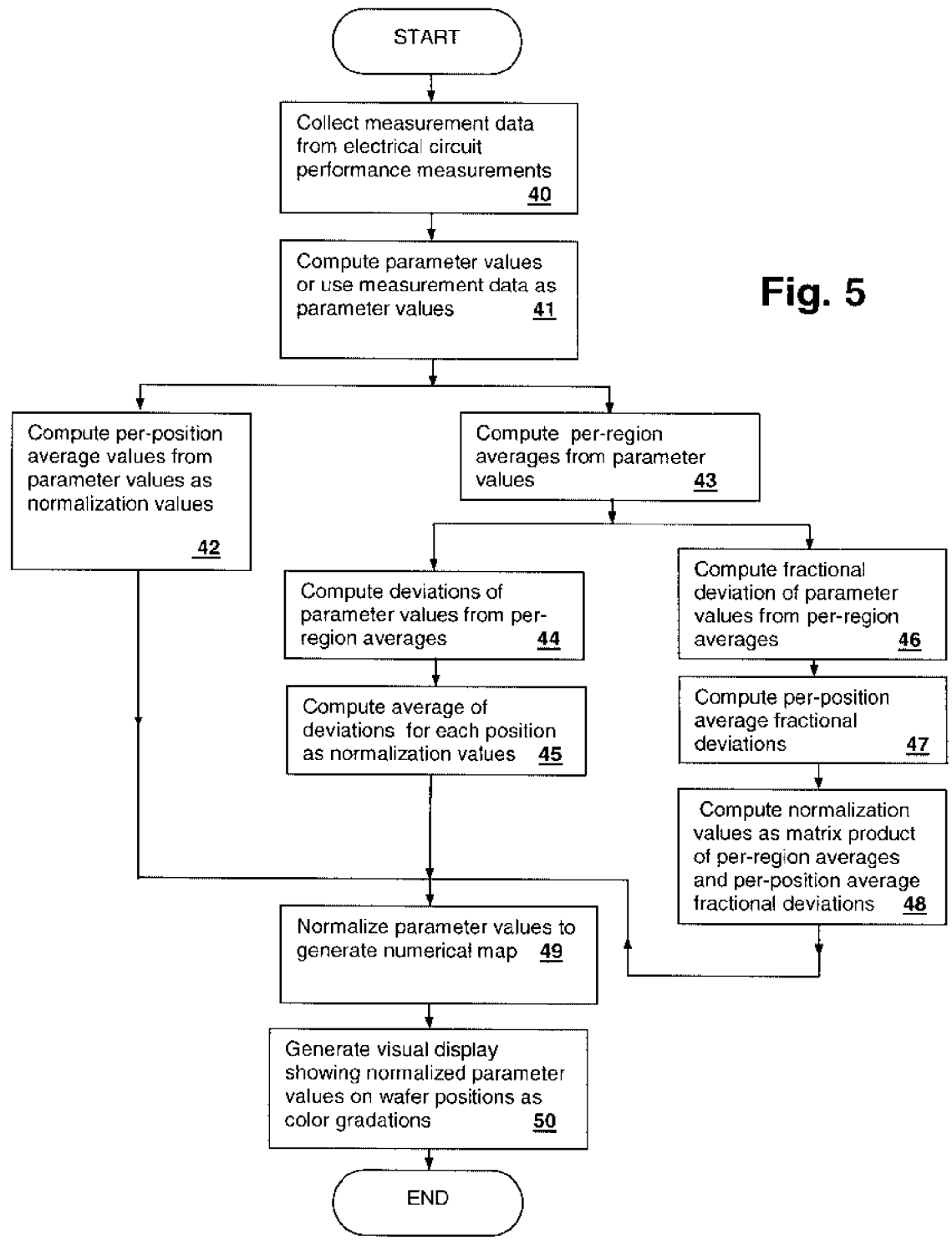
FIG. 5 is a flow chart depicting methods in accordance with embodiments of the present invention.

Referring now to FIG. 5, methods as described above with respect to FIGS. 2-4 in accordance with embodiments of the present invention are shown in a flowchart. First, measurement data are collected from measurement of performance of electronic circuits on the wafer (step 40) and parameter values are computed from the measurement data, or the data themselves are used as parameter values (step 41). Next, for the embodiment depicted in FIG. 2, per-position average values are computed from the parameter values (step 42) as normalization values. Alternatively, as depicted in FIG. 3, per-region averages are computed from the parameter values (step 43), deviations of the parameter values from the per-region averages are computed (step 44) and an average of the deviations computed in step 44 is computed for each position to obtain the normalization values (step 45). As another alternative as shown in FIG. 4, per-region averages are computed from the parameter values (step 43), fractional deviations of the parameter values from the per-region averages are computed (step 46), the fractional deviations are averaged on a per-position basis to get per-position average fractional deviations (step 47), and the normalization values are computed as a matrix product of the per-region averages and the per-position average fractional deviations (step 48). Next, the parameter values are normalized using the normalization values computed in computed in step 42, step 45 or step 48 to generate a numerical map (step 49). Finally, a visual display is generated showing the normalized parameter values on a map of corresponding wafer positions as color gradations (step 50). In each of the above-described methodologies, multiple sets of wafer data may be employed to further improve the position-based averages, or the measurement data across multiple sets of wafer data may be averaged to determine wafer-level variations for a lot of wafers, multiple lots of wafers, or a collection of wafers not organized by lot, rather than a single wafer. The normalization values computed by the present invention may also be stored and used as historical normalization values for visualizing and/or numerically mapping other wafers, so that the normalization values do not have to be computed for each wafer, lot or other group of measurement data.

Figure 6:
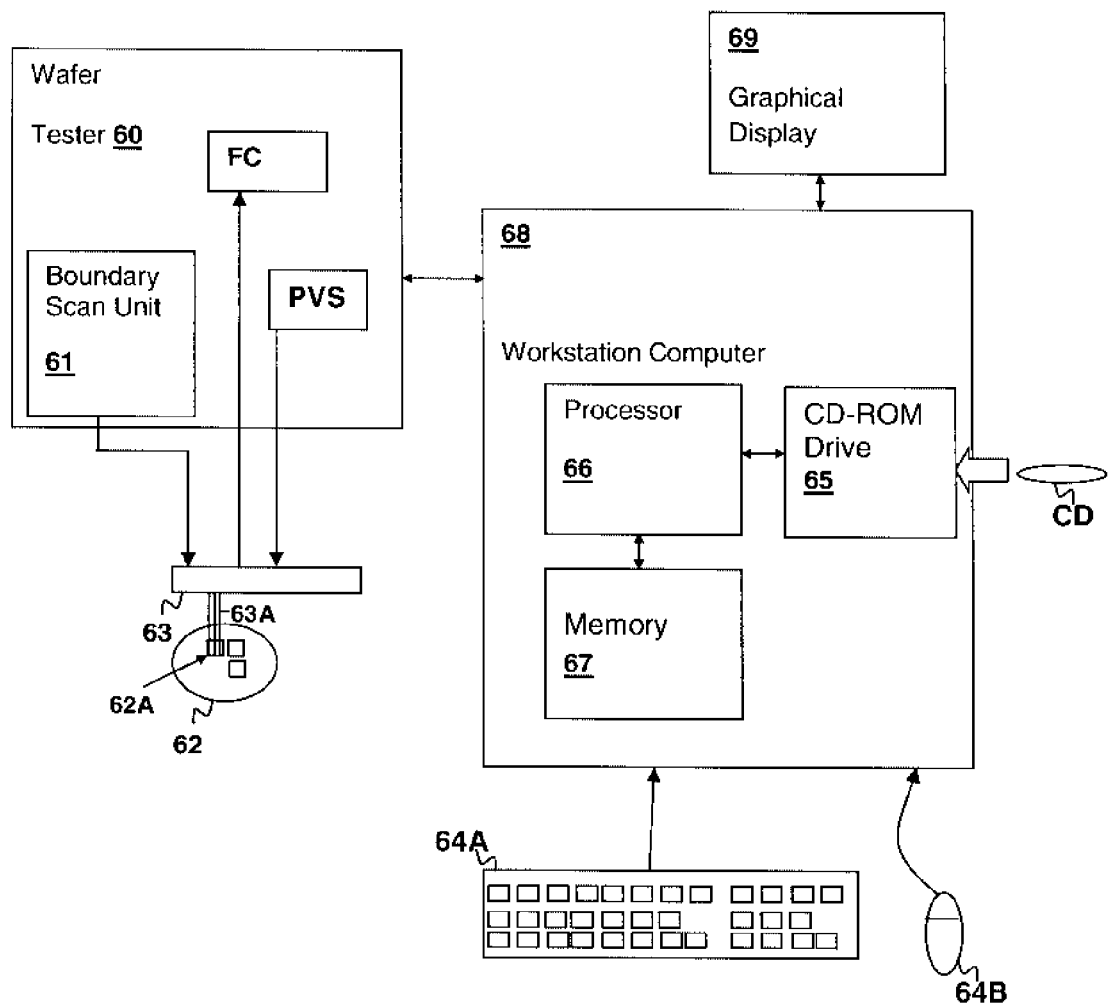
FIG. 6 is a pictorial diagram of a wafer test system in which methods in accordance with an embodiment of the present invention are performed.

Referring now to FIG. 6, a wafer test system in which a method according to an embodiment of the invention is performed, is shown. A wafer tester 60 includes a boundary scan unit 61 for providing stimulus to a die or kerf circuit 62A on a wafer under test 62, via a probe head 63 having electrical test connections 63A to die 62A. Wafer tester 60 also includes a programmable voltage source PVS and a programmable-frequency clock source FC, that are all coupled to die 62A via probe head 63 electrical test connections 63A.

A workstation computer 68, having a processor 66 coupled to a memory 67, for executing program instructions from memory 67, wherein the program instructions include program instructions for executing one or more methods in accordance with an embodiment of the present invention, is coupled to wafer tester 60, whereby the measurements described above are performed and measurements collected and stored in memory 67 and/or other media storage such as a hard disk. A CD-ROM drive 65 provides for import of program instructions in accordance with embodiments of the present invention that are stored on media such as compact disc CD. Workstation computer 68 is also coupled to a graphical display 69 for displaying program output such as graphical maps of normalized parameters provided by embodiments of the present invention. Workstation computer 68 is further coupled to input devices such as a mouse 64B and a keyboard 64A for receiving user input. Workstation computer may be coupled to a public network such as the Internet, or may be a private network such as the various "intranets" and software containing program instructions embodying methods in accordance with embodiments of the present invention may be located on remote computers or locally within workstation computer 68. Further, workstation computer 68 may be coupled to wafer tester 60 by such a network connection.

While the system of FIG. 6 depicts a configuration suitable for sequential test of a plurality of dies on a wafer, the depicted system is illustrative and not a limitation of the present invention. Probe head 63 may be a multi-die full wafer probe system, or may comprise multiple probe heads for simultaneously testing multiple wafers on a single or multiple die basis. Additionally, while boundary scan control of the circuits on the wafer is illustrated, the techniques of the present invention may also be applied without boundary scan control by using external stimuli to determine failure frequencies/voltages as described above or by execution of test code from a processor incorporated on wafer 62 with appropriate connections to ring oscillators and/or other test circuits on wafer 62. The resultant generated display or data exported from workstation computer 68 includes graphical depictions and numerical maps of the normalized parameters $R_{ij}$ as described above.

While the invention has been particularly shown and described with reference to the preferred embodiments thereof, it will be understood by those skilled in the art that the foregoing and other changes in form, and details may be made therein without departing from the spirit and scope of the invention.

What is claimed is:

1. A computer-performed method for visually displaying or numerically mapping systematic wafer-level circuit variation, the method comprising:
    collecting measurement data from electronic circuits integrated on a wafer, wherein the measurement data is collected from multiple positions within multiple regions of the wafer and is indicative of performance of the electronic circuits;
    within a computer system, determining a set of parameter values dependent on the measurement data for the multiple positions in the multiple regions;
    computing a set of normalization values from the set of parameter values for removing per-position systematic variation;
    adjusting the set of parameter values using the normalization values to remove the per-position systematic variation; and
    displaying a result of the adjusting as a visual map of wafer level variation or storing the result of the adjusting as a numerical map of wafer level variation in a storage device within the computer system, wherein the visual map or numerical map indicates parameter value levels corresponding to the position within the regions, wherein the computing comprises averaging the parameter values for each region to obtain an average parameter value corresponding to each region, computing deviations of the parameter values from the average parameter value for the corresponding region, and averaging the deviations for each position to obtain average deviations, and wherein the adjusting comprises subtracting the average deviations from the parameter values, whereby per-position systematic variation is removed from the parameter values.

2. The computer-performed method of claim 1, wherein the parameter values dependent on the measurement data are values of the measurement data and the determining the set of parameter values uses the measurement data as the parameter values.

3. The computer-performed method of claim 1, wherein the parameters dependent on the measurement data are determined from a mathematical function of values of the measurement data collected from at least two different circuits co-located near the multiple positions in the regions.

4. The computer-performed method of claim 1, further comprising operating the electronic circuits to determine a failure point with respect to an operating parameter by varying the operating parameter to determine an operating point of the given operating parameter that defines a failure boundary, wherein the collecting stores the value of the operating parameter as the measurement data.

5. A workstation computer system including a memory for storing program instructions for visually displaying or numerically mapping systematic wafer-level circuit variation, and a processor for executing said program instructions, wherein said program instructions comprise program instructions for:
    collecting measurement data from electronic circuits integrated on a wafer, wherein the measurement data is collected from multiple positions within multiple regions of the wafer and is indicative of performance of the electronic circuits;
    determining a set of parameter values dependent on the measurement data for the multiple positions in the multiple regions;
    computing a set of normalization values from the set of parameter values for removing per-position systematic variation;
    adjusting the set of parameter values using the normalization values to remove the per-position systematic variation; and
    displaying a result of the adjusting as a visual map of wafer level variation or storing the result of the adjusting as a numerical map of wafer level variation in a storage device within the workstation computer system, wherein the visual map or numerical map indicates parameter value levels corresponding to the position within the regions, and wherein the program instructions for computing comprise program instructions for averaging the parameter values for each region to obtain an average parameter value corresponding to each region, computing deviations of the parameter values from the average parameter value for the corresponding region, and averaging the deviations for each position to obtain average deviations, and wherein the program instructions for adjusting comprise program instructions for subtracting the average deviations from the parameter values, whereby per-position systematic variation is removed from the parameter values.

6. The workstation computer system of claim 5, wherein the parameter values dependent on the measurement data are values of the measurement data and the program instructions for determining the set of parameter values use the measurement data as the parameter values.

7. The workstation computer system of claim 5, wherein the parameter values dependent on the measurement data are determined from a mathematical function of values of the measurement data collected from at least two different circuits co-located near the multiple positions in the regions.

8. The workstation computer system of claim 5, further comprising program instructions for operating the electronic circuits to determine a failure point with respect to an operating parameter by varying the operating parameter to determine an operating point of the given operating parameter that defines a failure boundary, wherein the collecting stores the value of the operating parameter as the measurement data.

9. A computer program product comprising a computer-readable storage media storing program instructions for execution by a workstation computer system for visually displaying or numerically mapping systematic wafer-level circuit variation, wherein said program instructions comprise program instructions for:
   collecting measurement data from electronic circuits integrated on a wafer, wherein the measurement data is collected from multiple positions within multiple regions of the wafer and is indicative of performance of the electronic circuits;
   determining a set of parameter values dependent on the measurement data for the multiple positions in the multiple regions;
   computing a set of normalization values from the set of parameter values for removing per-position systematic variation;
   adjusting the set of parameter values using the normalization values to remove the per-position systematic variation; and
   displaying a result of the adjusting as a visual map of wafer level variation or storing the result of the adjusting as a numerical map of wafer level variation in a storage device within the workstation computer system, wherein the visual map or numerical map indicates parameter value levels corresponding to the position within the regions, and wherein the program instructions for computing comprise program instructions for averaging the parameter values for each region to obtain an average parameter value corresponding to each region, computing deviations of the parameter values from the average parameter value for the corresponding region, and averaging the deviations for each position to obtain average deviations, and wherein the program instructions for adjusting comprise program instructions for subtracting the average deviations from the parameter values, whereby per-position systematic variation is removed from the parameter values.

10. The computer program product of claim 9, wherein the parameter values dependent on the measurement data are values of the measurement data and the program instructions for determining the set of parameter values use the values of the measurement data as the parameter values.

11. The computer program product of claim 9, wherein the parameter values dependent on the measurement data are determined from a mathematical function of values of measurement data collected from at least two different circuits co-located near the multiple positions in the regions.

12. A computer-performed method for visually displaying or numerically mapping systematic wafer-level circuit variation, the method comprising:
   collecting measurement data from electronic circuits integrated on a wafer, wherein the measurement data is collected from multiple positions within multiple regions of the wafer and is indicative of performance of the electronic circuits;
   within a computer system, determining a set of parameter values dependent on the measurement data for the multiple positions in the multiple regions;
   computing a set of normalization values from the set of parameter values for removing per-position systematic variation;
   adjusting the set of parameter values using the normalization values to remove the per-position systematic variation; and
   displaying a result of the adjusting as a visual map of wafer level variation or storing the result of the adjusting as a numerical map of wafer level variation in a storage device within the computer system, wherein the visual map or numerical map indicates parameter value levels corresponding to the position within the regions, wherein the computing comprises:
   averaging the parameter values for each region to obtain an average parameter value corresponding to each region, computing fractional deviations of the parameter values from the average parameter value for the corresponding region, averaging the fractional deviation for each position, and multiplying the average value for each region with each average fractional deviation for each position to yield a matrix of adjustment values having dimensions by region and position, and wherein the adjusting comprises subtracting the matrix from a corresponding matrix of parameter values, whereby per-position systematic variation is removed from the parameter values.

13. A workstation computer system including a memory for storing program instructions for visually displaying or numerically mapping systematic wafer-level circuit variation, and a processor for executing said program instructions, wherein said program instructions comprise program instructions for:
   collecting measurement data from electronic circuits integrated on a wafer, wherein the measurement data is collected from multiple positions within multiple regions of the wafer and is indicative of performance of the electronic circuits;
   determining a set of parameter values dependent on the measurement data for the multiple positions in the multiple regions;
   computing a set of normalization values from the set of parameter values for removing per-position systematic variation;
   adjusting the set of parameter values using the normalization values to remove the per-position systematic variation; and
   displaying a result of the adjusting as a visual map of wafer level variation or storing the result of the adjusting as a numerical map of wafer level variation in a storage device within the workstation computer system, wherein the visual map or numerical map indicates parameter value levels corresponding to the position within the regions, wherein the program instructions for computing comprise program instructions for averaging the parameter values for each region to obtain an average parameter value corresponding to each region, computing fractional deviations of the parameter values from the average parameter value for the corresponding region, averaging the fractional deviation for each position, and multiplying the average value for each region with each average fractional deviation for each position to yield a matrix of adjustment values having dimensions by region and position, and wherein the program instructions for adjusting comprise program instructions for subtracting the matrix from a corresponding matrix of parameter values, whereby per-position systematic variation is removed from the parameter values.

14. A computer program product comprising a computer-readable storage media storing program instructions for execution by a workstation computer system for visually displaying or numerically mapping systematic wafer-level circuit variation, wherein said program instructions comprise program instructions for:
- collecting measurement data from electronic circuits integrated on a wafer, wherein the measurement data is collected from multiple positions within multiple regions of the wafer and is indicative of performance of the electronic circuits;
- determining a set of parameter values dependent on the measurement data for the multiple positions in the multiple regions;
- computing a set of normalization values from the set of parameter values for removing per-position systematic variation;
- adjusting the set of parameter values using the normalization values to remove the per-position systematic variation; and
- displaying a result of the adjusting as a visual map of wafer level variation or storing the result of the adjusting as a numerical map of wafer level variation in a storage device within the workstation computer system, wherein the visual map or numerical map indicates parameter value levels corresponding to the position within the regions, wherein the program instructions for computing comprise program instructions for averaging the parameter values for each region to obtain an average parameter value corresponding to each region, computing fractional deviations of the parameter values from the average parameter value for the corresponding region, averaging the fractional deviation for each position, and multiplying the average value for each region with each average fractional deviation for each position to yield a matrix of adjustment values having dimensions by region and position, and wherein the program instructions for adjusting comprise program instructions for subtracting the matrix from a corresponding matrix of parameter values, whereby per-position systematic variation is removed from the parameter values.

* * * * *